United States Patent [19]
Singh

[11] Patent Number: 5,938,105
[45] Date of Patent: Aug. 17, 1999

[54] ENCAPSULATED BALL BONDING APPARATUS AND METHOD

[75] Inventor: Inderjit Singh, San Jose, Calif.

[73] Assignee: National Semiconductor Corporation, Santa Clara, Calif.

[21] Appl. No.: 08/890,354

[22] Filed: Jul. 9, 1997

Related U.S. Application Data

[63] Continuation-in-part of application No. 08/784,271, Jan. 15, 1997.

[51] Int. Cl.$^6$ .................................................. H01L 21/60
[52] U.S. Cl. ........................................ 228/180.5; 228/4.5
[58] Field of Search .................................. 228/4.5, 180.5

[56] References Cited

U.S. PATENT DOCUMENTS

| | | | |
|---|---|---|---|
| 3,357,090 | 12/1967 | Tiffany | 29/470 |
| 4,096,983 | 6/1978 | Beilein et al. | 228/122 |
| 4,219,143 | 8/1980 | Gailland | 228/159 |
| 4,415,115 | 11/1983 | James | 228/170 |
| 4,437,604 | 3/1984 | Razon et al. . | |
| 4,717,066 | 1/1988 | Goldenberg et al. | 228/179 |
| 4,750,666 | 6/1988 | Neugebauer et al. | 228/160 |
| 4,761,386 | 8/1988 | Buynoski | 437/203 |
| 4,763,826 | 8/1988 | Kulicke, Jr. et al. . | |
| 4,821,945 | 4/1989 | Chase et al. | 228/179 |
| 4,886,200 | 12/1989 | Tsumura | 228/1.1 |
| 4,907,734 | 3/1990 | Conru et al. | 228/123 |
| 4,955,523 | 9/1990 | Calomagno et al. | 228/179 |
| 4,974,767 | 12/1990 | Alfaro et al. . | |
| 5,060,843 | 10/1991 | Yasuzato et al. | 228/179 |
| 5,111,989 | 5/1992 | Holdgrafer et al. . | |
| 5,148,964 | 9/1992 | Shimizu | 228/102 |
| 5,195,682 | 3/1993 | Rabinovich | 228/179 |
| 5,201,454 | 4/1993 | Alfaro et al. | 228/4.5 |
| 5,206,186 | 4/1993 | Neugebauer et al. | 437/183 |
| 5,244,140 | 9/1993 | Ramsey et al. | 228/110.1 |
| 5,302,550 | 4/1994 | Hirota et al. | 437/194 |
| 5,402,927 | 4/1995 | Frasch . | |
| 5,421,503 | 6/1995 | Perlberg et al. . | |
| 5,437,405 | 8/1995 | Asanasavest | 228/4.5 |
| 5,465,899 | 11/1995 | Quick et al. | 228/180.5 |
| 5,494,207 | 2/1996 | Asanasavest | 228/4.5 |
| 5,516,029 | 5/1996 | Grasso et al. | 228/180.5 |
| 5,544,804 | 8/1996 | Test et al. | 228/180.5 |
| 5,558,270 | 9/1996 | Nachon et al. . | |
| 5,595,328 | 1/1997 | Safabakhsh et al. . | |
| 5,718,546 | 2/1998 | Yariv et al. . | |
| 5,764,486 | 6/1998 | Pendse | 361/774 |

FOREIGN PATENT DOCUMENTS

| | | | |
|---|---|---|---|
| 55-96643 | 7/1980 | Japan | 228/4.5 |
| 59-191338 | 10/1984 | Japan | 228/4.5 |
| 61-5536 | 1/1986 | Japan | 228/4.5 |
| 3-27544 | 2/1991 | Japan | 228/4.5 |

OTHER PUBLICATIONS

Electrical Interconnection, "Component and Discrete Chip Mounting Technologies", pp. 226–230 (No Date Available).

*Primary Examiner*—Patrick Ryan
*Assistant Examiner*—Jeffrey T. Knapp
*Attorney, Agent, or Firm*—Beyer & Weaver, LLP

[57] ABSTRACT

An improved capillary construction that includes a cavity suitable for at least partially molding a ball bond during a ball bonding operation as well as methods for wire bonding utilizing such a capillary are described. More specifically, a distal end of a bonding wire that passes through the capillary is ultrasonically welded to a bonding surface in a manner such that the cavity molds a significant portion of the ball bond during the ball bonding operation. The described arrangement permits the bonding force applied by the bonding machine that drives the capillary to be significantly reduced or eliminated. In some embodiments, the capillary is positioned at a predetermined standoff height relative to the bonding surface. The described arrangements have numerous advantages and permits bonding to bonding surfaces that are heated to a temperatures of less than approximately 150 degrees centigrade during the ultrasonic welding step. The resultant bonds tend to have significant intermetallic bonding over a majority of a contact surface between the ball bond and the bonding surface. The described capillary and methods works well with fine pitch devices, including devices having pitches of 70 microns or less.

16 Claims, 7 Drawing Sheets

ENCAPSULATED BALL BONDING APPARATUS AND METHOD

RELATED APPLICATIONS

This application is a continuation-in-part of application Ser. No. 08/784,271 filed Jan. 15th, 1997, which is incorporated herein by reference.

FIELD OF THE INVENTION

The present invention pertains to wire bonding used in packaging semiconductor devices and the like. More particularly, the present invention relates to improved capillary designs and ball bonding techniques utilizing such capillaries.

BACKGROUND OF THE INVENTION

There has been a continuing trend in the semiconductor industry toward smaller semiconductor devices with higher transistor density and an increasing number of input/output connections. This trend has led to semiconductor devices having an increased density of chip input/output connections and shrinking bond pad sizes. Semiconductor devices having small bond pad center to center distances are called fine pitch semiconductor devices. Wire bonding technology is currently being challenged by requirements of semiconductor devices having bonding pad center to center distances of less than 100 micrometers.

In semiconductor fabrication, wire bonding remains the dominant chip interconnection technology for fine pitch semiconductor devices. Gold or aluminum wire is commonly used to connect a bonding pad of a semiconductor die to a lead of the semiconductor device. Typically, ball bonding is used to connect the wire to the bond pad while wedge bonding, also called stitch bonding, is used to connect the wire to the lead. Commonly, a wire bonding apparatus including a capillary is used for both the ball bonding and the wedge bonding.

Figure 1A:
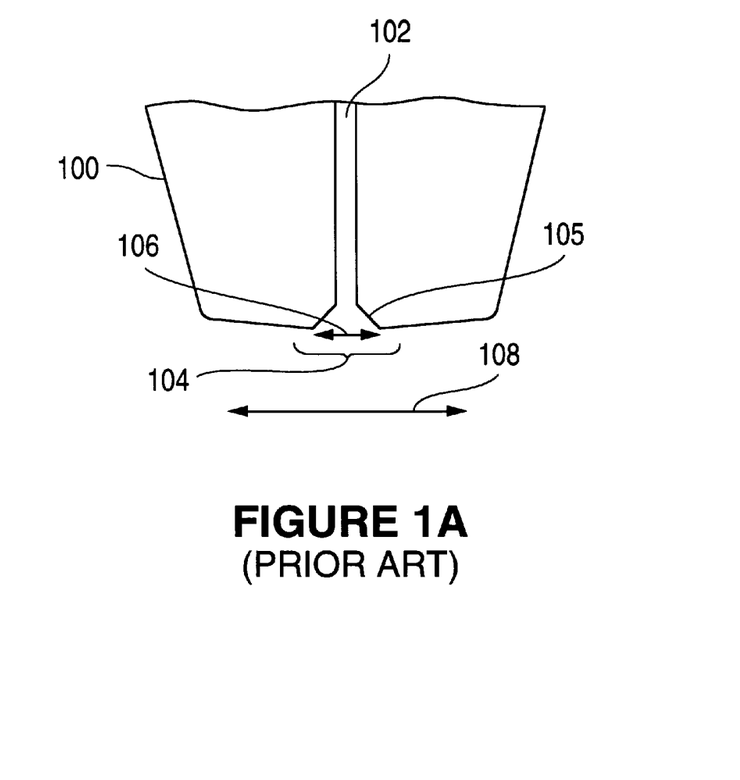
FIG. 1A is a diagrammatic vertical cross section of a prior art capillary suitable for wire bonding in semiconductor devices.

FIG. 1A shows a vertical cross section of a prior art capillary 100. The capillary 100 has a longitudinally extending wire feed bore 102 formed therethrough. The bore 102 typically includes a chamfer 105 that splays slightly outward towards the distal tip of the capillary 100. In operation, wire is fed downward through the wire feed bore 102, and out a bottom aperture 104 of the capillary 100.

Figure 1B:
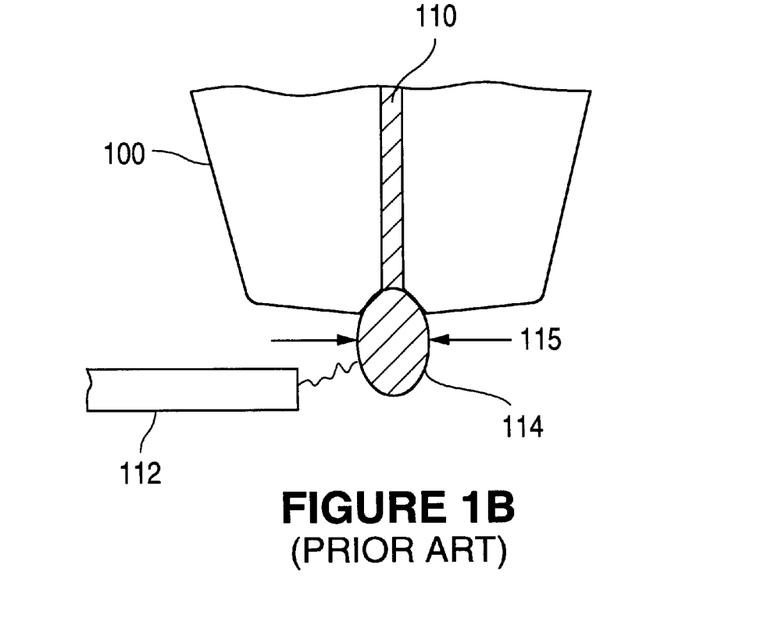
FIG. 1B is a diagrammatic vertical cross section of the prior art capillary illustrated in FIG. 1A illustrating the formation of a free air ball at the distal end of a bonding wire.

FIG. 1B shows a vertical cross section of the capillary 100 horizontally restraining a wire 110 while an electronic flame off mechanism (EFO) 112 applies energy to a distal end of the wire 110. The application of energy by the EFO 112 creates a free air ball 114 at the distal end of the wire 110. The wire 110 is held by a clamp (not shown) during this free air ball formation process. For a wire bonding apparatus using the capillary 100, the size of the free air ball 114 can be controlled by varying hardware and software parameters of the wire bonding apparatus. After formation of the free air ball 114, the clamp releases the wire 110 and the capillary 100 is used to apply a force to the free air ball 114 to bond the distal end of the wire 110 to a bond pad surface as explained below.

Figure 1C:
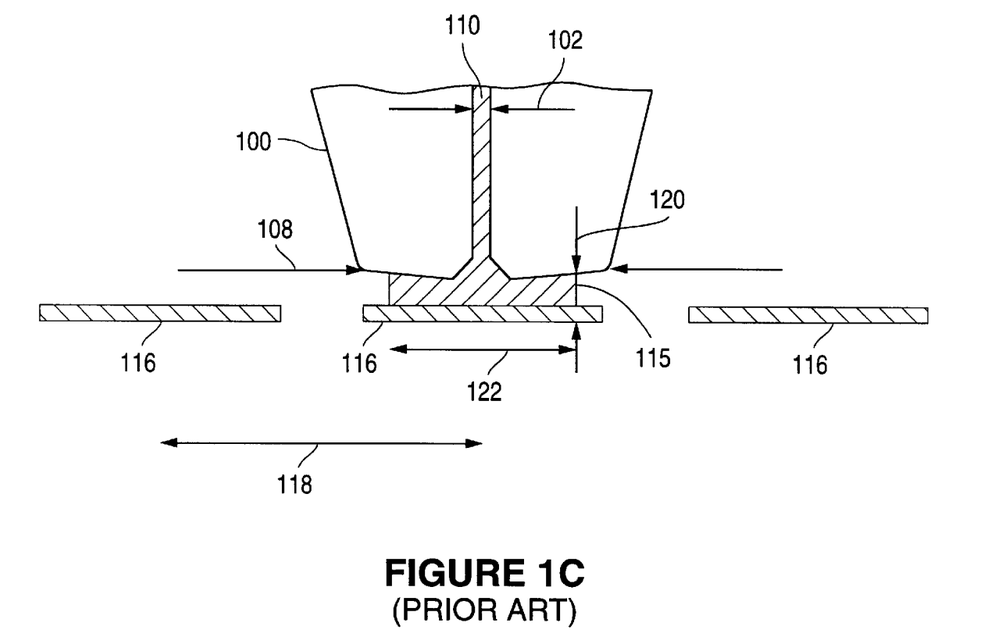
FIG. 1C is a diagrammatic vertical cross section of the prior art capillary illustrated in FIG. 1A illustrating a ball bond created by the bonding apparatus.

FIG. 1C shows a vertical cross section of the capillary 100 being used to form a ball bond 115 between the distal end of the wire 110 and a surface of a bond pad 116. The bond pad 116 is located on a semiconductor die which has a center to center bond pad distance 118 (also called the bond pad pitch of the semiconductor device). After the formation of the free air ball 114, as explained above, the free air ball 114 (FIG. 1B) is forced downward to the bond pad 116 by the capillary 100. The force of the capillary 100 is used in conjunction with ultrasonic energy to create the ball bond 115 between the distal end of the wire 110 and the bond pad 116. Size parameters associated with the ball bond 115 include a ball bond height 120 and a ball bond diameter 122.

As the center to center bond pad distance 118 (or bond pad pitch) is decreased in a semiconductor device, the size of the bond pad 116 is typically decreased. For example, a semiconductor device having a 70 micron bond pad pitch can have a 60 micron×60 micron bond pad 116. It is very difficult to consistently achieve a ball bond 115 small enough to fit on a bond pad 116 of this size using the capillary 100. The ball bond diameter 122 must be limited in order to prevent flash of wire metal over to an adjacent bond pad 116 thereby creating a short between adjacent bond pads 116. A short between adjacent bond pads 116 can result in operational failure of the semiconductor device.

With reference still to FIG. 1C, one problem with use of the capillary 100 is that it is difficult to precisely control the size of the ball bond 115. For a wire bonding apparatus using the capillary 100, the size of the ball bond 115 (including the ball bond height 120 and ball bond diameter 122) is dependent on the size of the free air ball 114 (FIG. 1B). Hardware and software parameters of the bonding apparatus must be adjusted to vary the size of the free air ball 114 (FIG. 1B). For a wire bonding apparatus using the capillary 100, the size of the ball bond 115 is also dependent on parameters such as the bonding power, bonding force, and time of the ultrasonic energy delivered during the formation of the ball bond 115. For ball bonding of fine pitch semiconductor devices, the tip dimension 108 of the capillary 100 can be reduced so that the capillary 100 can form a ball bond 115 small enough to fit on the small bond pad 116. However, reducing the outer diameter tip dimension 108 weakens the capillary 100 which is subjected to great stress particularly during wedge bonding as explained below. The most significant factors that decide the shape and strength of the ball bond 115 are the tip dimension 108 and chamfer diameter 106 of the capillary 100.

Another problem with using the capillary 100 to form a ball bond is that the desirable intermetallic bonding formation tends to occur primarily along the periphery of the ball bond 115. The ball bond 115, formed using the capillary 100, has very little or no intermetallic formation in the central surface region of the ball bond 115. The result is a weak ball bond 115. The intermetallic formation problem is due to the fact that the capillary 100 does not optimally translate ultrasonic energy during formation of the ball bond 115.

Figure 1D:
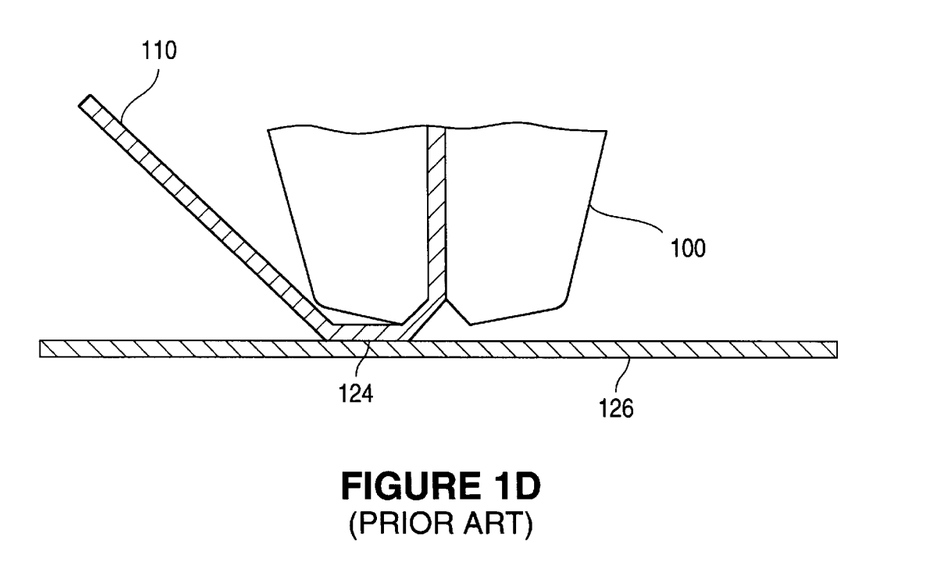
FIG. 1D is a diagrammatic vertical cross section of the prior art capillary illustrated in FIG. 1A illustrating a wedge bond created by the bonding apparatus.

FIG. 1D shows a vertical cross section of a wedge bond 124 formed by the capillary 100. The wedge bond 124 is formed between an extended length of the wire 110 and a surface of an inner lead 126 of a lead frame. Reducing the tip dimension 108 of the capillary 100, to reduce the size of the ball bond 115 as described above, causes degradation in strength of the wedge bond 124. This is due to the fact that the area in which the wedge bond 124 is formed depends on the outer diameter tip dimension 108 of the capillary 100. Therefore, a difficult problem with using the capillary 100 concerns the tradeoff between a small outer diameter tip dimension 108 for achieving small ball bonds and a larger outer diameter tip dimension 108 for achieving strong wedge bonds.

In view of the foregoing, it should be apparent that improved wire bonding techniques would be desirable.

SUMMARY OF THE INVENTION

An improved capillary construction that includes a cavity suitable for at least partially molding a ball bond during a ball bonding operation as well as methods for wire bonding utilizing such a capillary are described. More specifically, a distal end of a bonding wire that passes through the capillary is ultrasonically welded to a bonding surface in a manner such that the cavity molds a significant portion of the ball bond during the ball bonding operation.

In one preferred embodiment, a bonding force applied by the bonding machine that drives the capillary is significantly reduced or eliminated. In some embodiments, the capillary is positioned at a predetermined standoff height relative to the bonding surface. By way of example, standoff distances on the order of 5 to 10 microns work well.

The described arrangements have numerous advantages and permits bonding to bonding surfaces that are heated to a temperatures of less than approximately 150 degrees centigrade during the ultrasonic welding step. Preheating temperature of less than approximately 130 degrees centigrade and even lower then 100 degrees centigrade are possible. The resultant bonds tend to have significant intermetallic bonding over a majority of a contact surface between the ball bond and the bonding surface. The described invention works well with fine pitch devices, including devices having pitches of 70 microns or less.

In another embodiment, relatively larger diameter bonding wires may be used even in very fine pitch devices which facilities relatively longer wire spans in such devices.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well known processes, procedures, components, and circuits have not been described in detail so as not to unnecessarily obscure aspects of the present invention.

Figure 2:
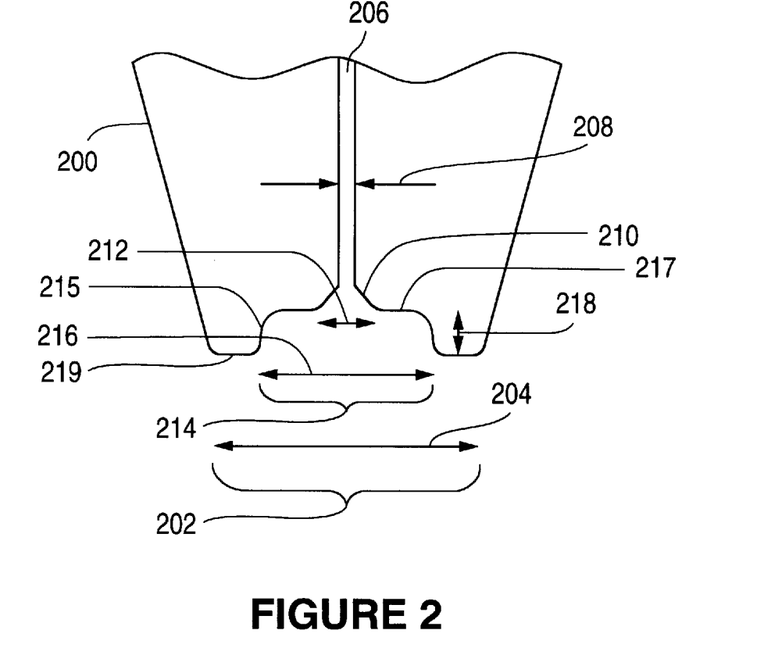
FIG. 2 is a diagrammatic vertical cross section of a capillary formed in accordance with one embodiment of the present invention.

Referring initially to FIG. 2, a diagrammatic vertical cross section of a capillary 200 suitable for use with the present invention is shown. The capillary 200 can be used for both ball bonding and wedge bonding. In an embodiment of the present invention, the capillary 200 may have a substantially standard exterior form which slightly tapers from a top end (not shown) of the capillary 200 to a bottom end of the capillary 200. The bottom end of the capillary 200 forms a capillary tip 202. The capillary tip 202 has an outer diameter tip dimension 204. The outer diameter tip dimension 204 can be varied depending on the needs of a particular application. Outer tip dimensions 204 in the range of 150 to 200 microns work well for most applications. By way of example, an outer diameter tip dimension 204 of about 70 microns (2.8 mils) has been found to work well for use in wire bonding of a semiconductor device having a 60 micron center to center bond pad distance. An outer diameter tip dimension 204 of about 84 microns (3.3 mils) has been found to work well for use in wire bonding of a semiconductor device having a 70 micron center to center bond pad distance.

A wire feed bore 206, having a minimum bore diameter 208, extends from the top end of the capillary 200 towards the capillary tip 202. As is well know in the art, the minimum bore diameter 208 can be varied depending on the diameter of wire required for a bonding application. For example, a minimum bore diameter 208 of about 33 microns (1.3 mils) works well for wire bonding applications requiring a wire diameter of about 25.4 microns (1 mil). Similarly, a minimum bore diameter of about 41 microns (1.6 mils) works well for applications requiring a wire diameter of about 33 microns (1.3 mils).

The wire feed bore 206 may include a chamfer 210 that opens into a walled cavity 214. In an embodiment of the present invention, the chamfer 210 can widen in a direction from the top end of the capillary 200 towards the cavity 214 at an angle which can vary depending on the needs of a particular application. By way of example, chamfer face angles of between about 0 degrees and about 10 degrees have been found to work well. The chamfer 210 has a maximum chamfer diameter 212. The maximum chamfer diameter 212 can be varied depending on the needs of a particular wire bonding application. For wire bonding applications requiring wire having a diameter of about 25.4 microns, a maximum chamfer diameter 212 of about 36 microns to about 38 microns has been found to work well. In wire bonding applications requiring wire having a diameter of about 33 microns, a maximum chamfer diameter 212 of about 45 microns (1.8 mils) has been found to work well.

A walled cavity 214 in the capillary tip 202 is adjacent to and continuous with the chamfer 210 in the wire feed bore 206. The cavity 214 defines cavity walls 215 and a recessed tip surface 217. In an embodiment of the present invention, the cavity 214 is substantially cylindrical and has a cavity diameter 216 which is greater than the maximum chamfer diameter 212 of the chamfer 210. The recessed tip surface 217 can be tapered relative to a horizontal axis. In another embodiment of the present invention, the cavity walls 215 are tapered relative to a vertical axis so that the cavity 214 is substantially frusto-conical. By way of example, tapers in the range of approximately zero to 10° degrees, as for example, in the range of about 5–10° works well. The cavity diameter 216 can be varied depending on the needs of a particular wire bonding application. For example, cavity diameters 216 of about 40 microns to about 46 microns have been found to work well for use in wire bonding of semiconductor devices having center to center bond pad distances of about 60 microns. Cavity diameters of about 50 microns (2 mils) work well for use in wire bonding of devices having center to center bond pad distance of about 70 microns. Of course bigger capillaries can have correspondingly larger cavity diameters as well. The cavity 214 has a cavity height 218. The cavity height 218 can also be varied depending on the needs of a particular wire bonding application. By way of example cavity heights in the range of approximately 10 to 15 microns work well. For example, a cavity height 218 of about 15 microns has been found to work well for use in wire bonding of semiconductor devices having center to center bond pad distances of about 60 microns to about 70 microns. In an embodiment of the present invention, all edges of the cavity 214 are rounded. The portion of the capillary tip 202 outside of the cavity 214 defines a wedge surface 219.

With reference still to FIG. 2, the capillary 200 can be used with a wire bonding apparatus (not shown) for both ball bonding and wedge bonding. In operation, wire is fed through the wire feed bore 206. For ball bonding, an electronic flame off (EFO) mechanism is used to create a free air ball at a distal end of the wire. Then, the cavity 214 at the distal end 202 of the capillary 200 is used, in conjunction with ultrasonic energy provided by the wire bonding apparatus, to ultrasonically weld the free air ball to a suitable bonding surface (as for example, a bond pad on a semiconductor device) in order to create a ball bond. The cavity 214 of the capillary 200 provides precision small ball bonds which are strong as explained below. The capillary 200 is well suited for use in ball bonding of semiconductor devices having very small center to center bond pad distances (fine bond pad pitch) and very small bond pad surface areas. The capillary 200 is also well suited for use in wedge bonding of semiconductor devices having very small center to center lead, trace or contact distances (e.g. fine pitch lead frames). These and other advantages of the present invention are explained below.

Figure 3:
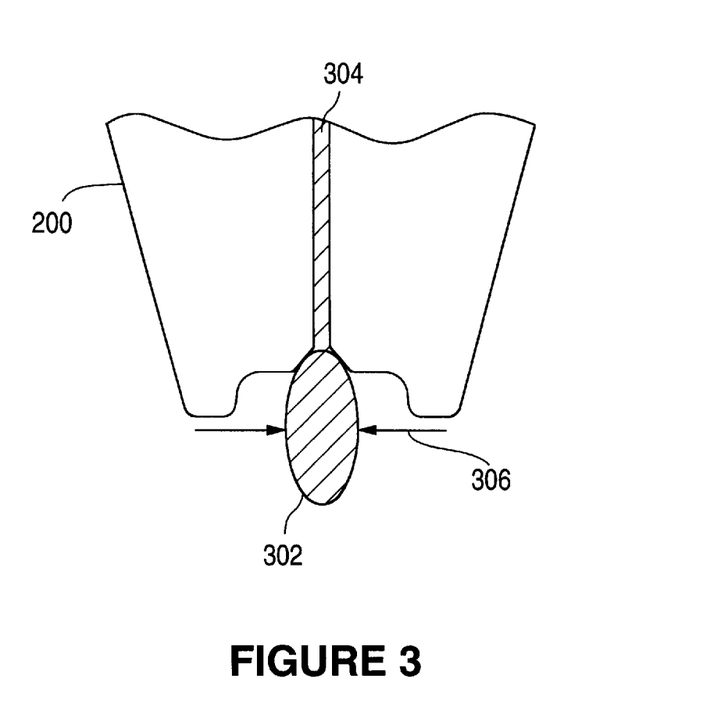
FIG. 3 is a diagrammatic vertical cross section of the capillary illustrated in FIG. 2 illustrating the formation of a free air ball at the distal end of a bonding wire.

FIG. 3 shows a vertical cross section of a free air ball 302 at a distal end of a wire 304 which is horizontally constrained by the capillary 200. The bonding wire may be formed from any suitable material, although as is well known to those skilled in the art, gold is most typical. Alternatively, aluminum and other materials may be used as well. The free air ball 302 has a free air ball diameter 306. As mentioned above, an EFO mechanism is used in conjunction with wire bonder hardware and software to create the free air ball 302. The cavity 214 of the capillary 200 allows for consistent free air ball formation with no need to enhance bonder hardware and software. In an embodiment of the present invention, the EFO mechanism and other parameters can be controlled so that the free air ball 302 has a volume slightly larger than the volume of the cavity 214 of the capillary 200.

One feature of the described capillary construction is that unlike the prior art capillaries, with the proper selection of the free air ball size, the size a ball bond is somewhat independent of the diameter of the bonding wire. Rather, the ball bond size may be primarily defined by the cavity 214 itself. It should be appreciated that this can be a significant advantage in many applications since bigger wires may be used even in fine pitch devices. By way of example, 1.3 mil wires may be used in devices having pitches under approximately 125 microns, as for example in 70–80 micron in-line fine pitch devices. The use of larger diameter bonding wires permits longer wire spans then would otherwise be permissible when plastic packaging is used since the larger diameter bonding wires are less susceptible to wire sweep. By way of example, using a 1.3 mil bonding wire, wire spans of greater than 200 mils, as for example 220 mils and 250 mils have been shown to work well in plastic molded 70 micron pitch in-line devices. In contrast, in the applicant's experience, 70 micron pitch devices using 1 mil bonding wire are generally limited to maximum spans on the order of 160 mils.

Conventional wire bonding machines typically permit the control of a number of parameters during ball bonding. These include, the intensity of ultrasonic energy applied to the bond (i.e. the bond power), the duration of the bonding (i.e. bonding time), the force applied during bonding (i.e. bond force) and the temperature utilized during bonding. By way of example, typical conventional parameters of an ESEC 3006 F/X bonder available from Suizer of Cham, Switzerland for use in forming ball bonds on a 70 micron pitch die using a 1 mil wire and forming a 36 micron free air ball might be on the order of 19% bond power, using 300 mN force for a duration of approximately 25 milli-seconds at a temperature on the order of 220 degrees. Of course, these numbers are interdependent and can be varied somewhat based on the needs of a particular system. There are a number of applications where it is desirable to lower the temperature during bonding. One example is in grid array type packages (e.g. BGAs, PGAs, etc.) where a temperature sensitive substrate material such as BT, FR4 or high temperature epoxy is used. However, the industry today is struggling to make reliable bonds at temperatures on the order of 150 degrees C.

In the present invention, the molding effect of the cavity 214 provides a number of advantages which allow the use of very different bonding parameters and machine settings during ball bonding. Significantly, the primary variable becomes bond power and experiments have shown that the force applied during bonding can be significantly reduced or completely eliminated. Additionally, the bonding temperature may also be significantly reduced. By way of example, bond temperatures on the order of 100–140 degrees C. are readily attainable.

Figure 4A:
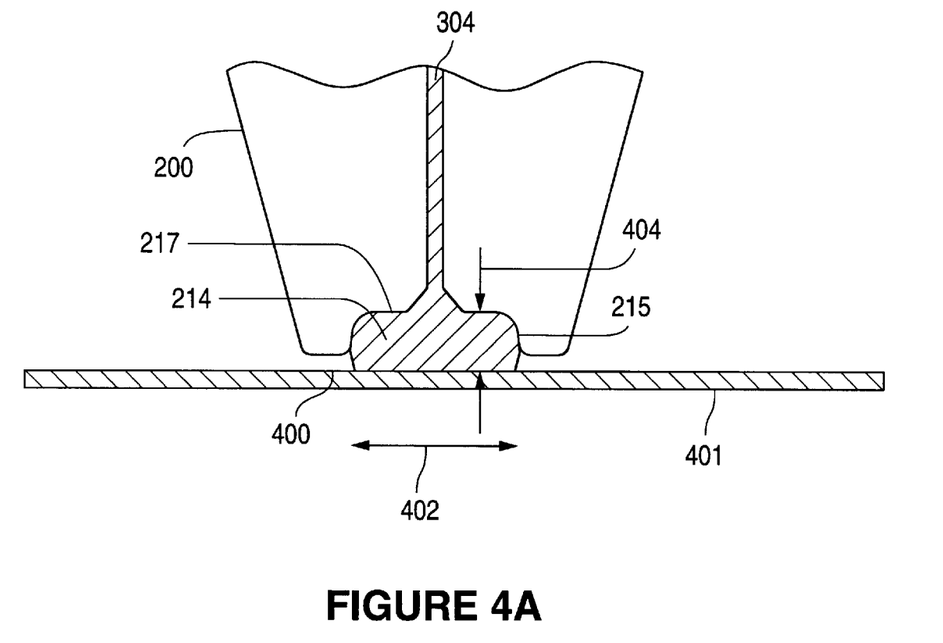
FIGS. 4a and 4b are diagrammatic vertical cross section of the capillary illustrated in FIG. 2 illustrating different ball bond that may be created by the bonding apparatus.

Referring next to FIGS. 4a, the capillary 200 allows for formation of a small precision ball bond 400. The cavity 214 of the capillary 200 molds the ball bond 400. The recessed tip surface 217 and the cavity walls 215 cooperate to mold the upper portion of the ball bond 400 into a shape that is substantially similar to the shape of the cavity 214. The size, shape and footprint of a lower portion of the ball bond 400 can be carefully controlled by controlling the size of the free air ball 302 (shown in FIG. 3) together with a standoff between the bonding surface 401 and the capillary tip 202. This is believed to be due to molding effects of the cavity 214 combined with the surface tension of the liquefied bonding wire material that forms the free air ball. As pointed out above, in many situations the effect of the bonding force applied by the wire bonding machine can be substantially eliminated. In such situations, the capillary tip may be positioned at a fixed height above the bonding surface 401 (in the embodiment shown, a bond pad on a die). Since the free air ball 302 is larger than the cavity 214 it contacts the bonding surface and may be ultrasonically welded thereto.

FIG. 4a shows a vertical cross section of a ball bond 400 formed by a wire bonding apparatus using the capillary 200 of the present invention. The ball bond 400 is formed between the distal end of the wire 304 and a bond pad 401. A wire bonding apparatus (not shown) is used in conjunction with the capillary 200, ultrasonic energy and thermal energy from a heating stage to form the ball bond 400. Size parameters of the ball bond 400 include a footprint 402 and a ball bond height 404. When the free air ball size and the standoff are carefully calculated, "flash" (i.e. material that extends beyond the cavity) can be substantially eliminated and the footprint 402 can be precisely controlled.

One interesting observation is that tests have shown that the footprint 402 can actually be smaller than the maximum diameter of the cavity 214 itself. Indeed, in one embodiment, the portion of the ball bond below the surface of the capillary tip 202 tends to take on an inverted frusto-conical shape with the contact surface formed between the bonding surface 401 and the ball bond being smaller than the opening diameter of the cavity 214. In this embodiment, no apparent bonding force is used on the bonding machine and the standoff between the capillary tip 202 and the bond pad 401 is set at a fixed distance. The appropriate free air ball size is calculated based on the cavity size and the desired standoff distance. The standoff height may be varied somewhat in accordance with the needs of a particular application. By way of example, standoff distances on the order of approximately 5 to 15 microns appear appropriate, and standoff distances in the range of approximately 5–10 microns have been tested with success. With this arrangement, the footprint of the ball bond can be reduced by increasing the standoff height (within reason), which may prove particularly useful as bond pad pitch is even further reduced.

It is noted that accurate control of the standoff height is important to the success of the embodiment shown in FIG. 4a. Many conventional wire bonding machines do not come standard with software for controlling the height of the capillary above the bonding surface. However, for most wire bonding machines this is believed to be a relatively straight forward modification. By way of example, a number of experiments have been successfully performed using a model ESEC 3006F/X wire bonding machine available from Suizer of Cham, Switzerland. Using such a machine and a capillary having a 1.3 mil bonding wire, and a cavity diameter of about 2 mils, bonding times on the order of 10 milliseconds@ 10–12% power worked well. In contrast, typical settings for the same machine when used for conventional ball bonding might utilize a bonding time on the order of 25 milliseconds @ 19% power with a bonding force of 300 mN. Of course, the setting used for various applications may be widely varied.

Figure 4B:
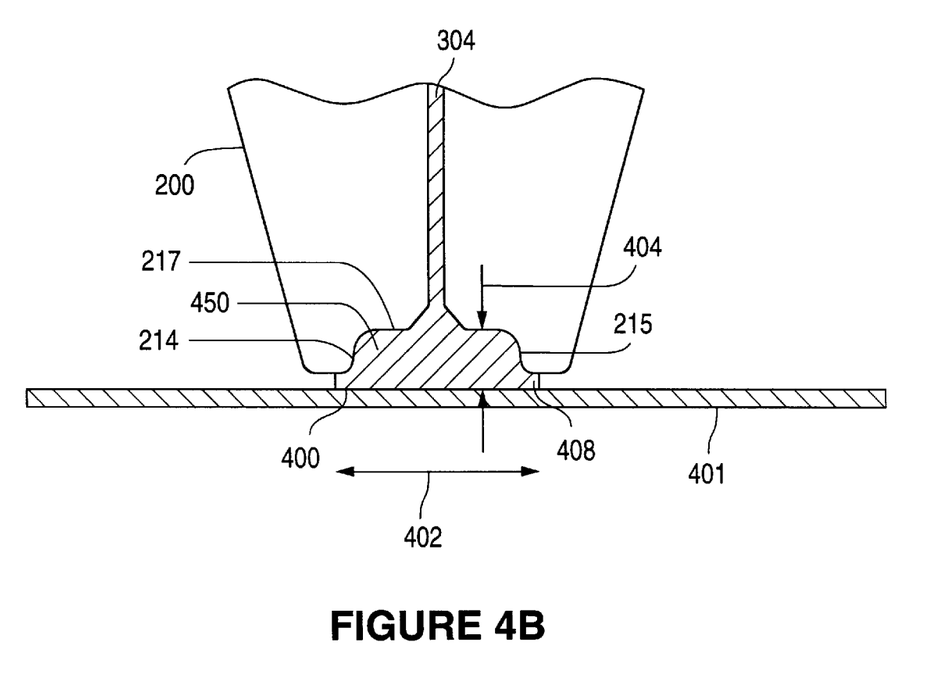

Referring next to FIG. 4b, an alternative embodiment is illustrated. In this embodiment, a certain amount of flash 408 is formed under the capillary outside of the capillary. This type of ball bond structure is typically formed when the size of the free air ball is slightly larger than the volume required to form the ball bond of FIG. 4a for a given standoff distance. Such ball bond structures are also typical when a small bonding force is used to position the capillary with respect to the bonding surface. Of course, the upper portion of the ball bond 450 conforms to the cavity 214.

By controlling the size of the free air ball relative to the cavity size, the amount of "flash" can be controlled. When the free air ball is slightly larger than the cavity size and the appropriate offset volume, there will be some flash of wire metal out from the perimeter of the cavity 214 (as depicted in exaggerated form in FIG. 4b), meaning the ball bond diameter 402 is greater than the cavity diameter 216. Although such arrangements work well, they are slightly less consistent than optimally formed balls.

The size of a ball bond 400, formed using the capillary 200, is dependent primarily on the size of the free air ball 302 in conjunction with the standoff distance. Due to molding effects of the cavity 214, the size of the ball bond 400, formed using the capillary 200, is not overly dependent on the power, force, and time duration of the ultrasonic energy delivered during formation of the ball bond 400.

The molding nature of the cavity 214 provides a strong ball bond 400 by allowing for even distribution of bonding on the bonding surface. More specifically, there is significant intermetallic formation relatively evenly distributed throughout the entire contact surface formed between the ball and the bonding surface. This even bonding surface distribution is believed to result because the cavity 214 of the capillary 200 allows for more effective translation of ultrasonic energy during formation of the ball bond 400. Specifically, it is believed that during the ball bonding process, the cavity walls 215 apply inward force upon the wire metal in the cavity 214. The inward force applied by the cavity walls 215 contributes to the formation of the evenly distributed intermetallic formation at the interface of the wire metal and bond pad metal. In contrast, significant intermetallic formation in conventional ball bond tends to form primarily in a annular ring about the periphery of the bond. By way of example, the typical shear strength of a ball bond using a gold 1 mil diameter bonding wire on an aluminum bond pad in a 70 micron pitch device may be on the order of 18 grams. In contrast, experiments have shown that shear strength on the order of 22–25 grams are readily obtained using the described arrangement.

Figure 5:
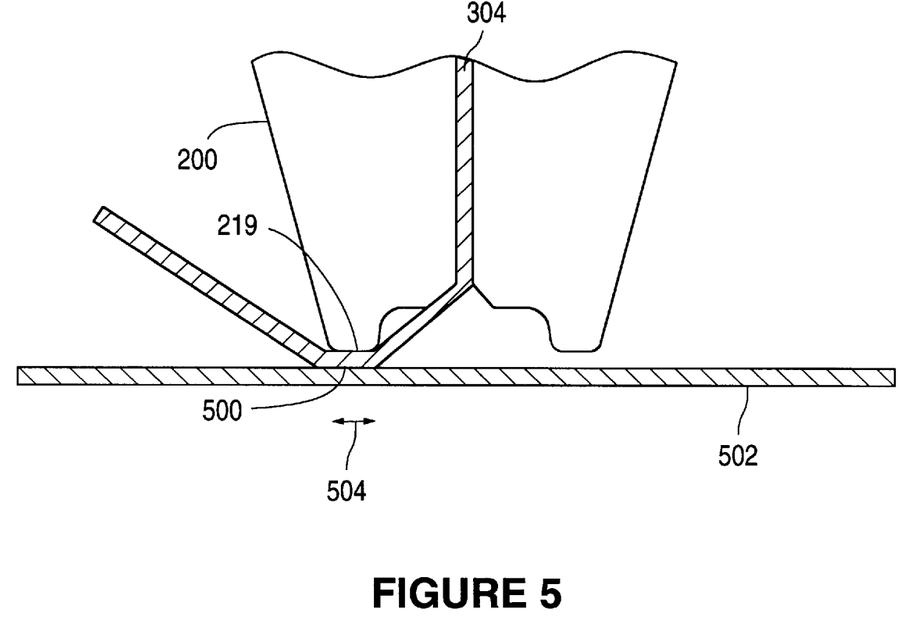
FIG. 5 is a diagrammatic vertical cross section of the capillary illustrated in FIG. 2 illustrating a wedge bond created by the bonding apparatus.

FIG. 5 shows a vertical cross section of a wedge bond 500 formed by a wire bonding apparatus using capillary 200. During wedge bonding, the wedge surface 219 of the capillary 200 applies a force to a section of the wire 304. The wedge bond 500 can be formed between the section of the wire 304 and a surface of a lead 502 of a semiconductor device. A wire bonding apparatus using the capillary 200 requires a relatively small area of contact to make a wedge bond 500. The wedge bond 500 has a wedge bond length 504. Because a wire bonding apparatus using the capillary 200 of the present invention requires a small area of contact to make a wedge bond 500, the capillary 200 is particularly useful for forming wedge bonds 500 on very fine inner lead pitch frames.

As described above, the size of the ball bonds is substantially independent of the overall diameter 202 of the capillary tip. Thus, in many applications, the overall tip diameter, and thus the size of wedge surface 219 can be optimized for optimal stitch bonding.

Figure 6:
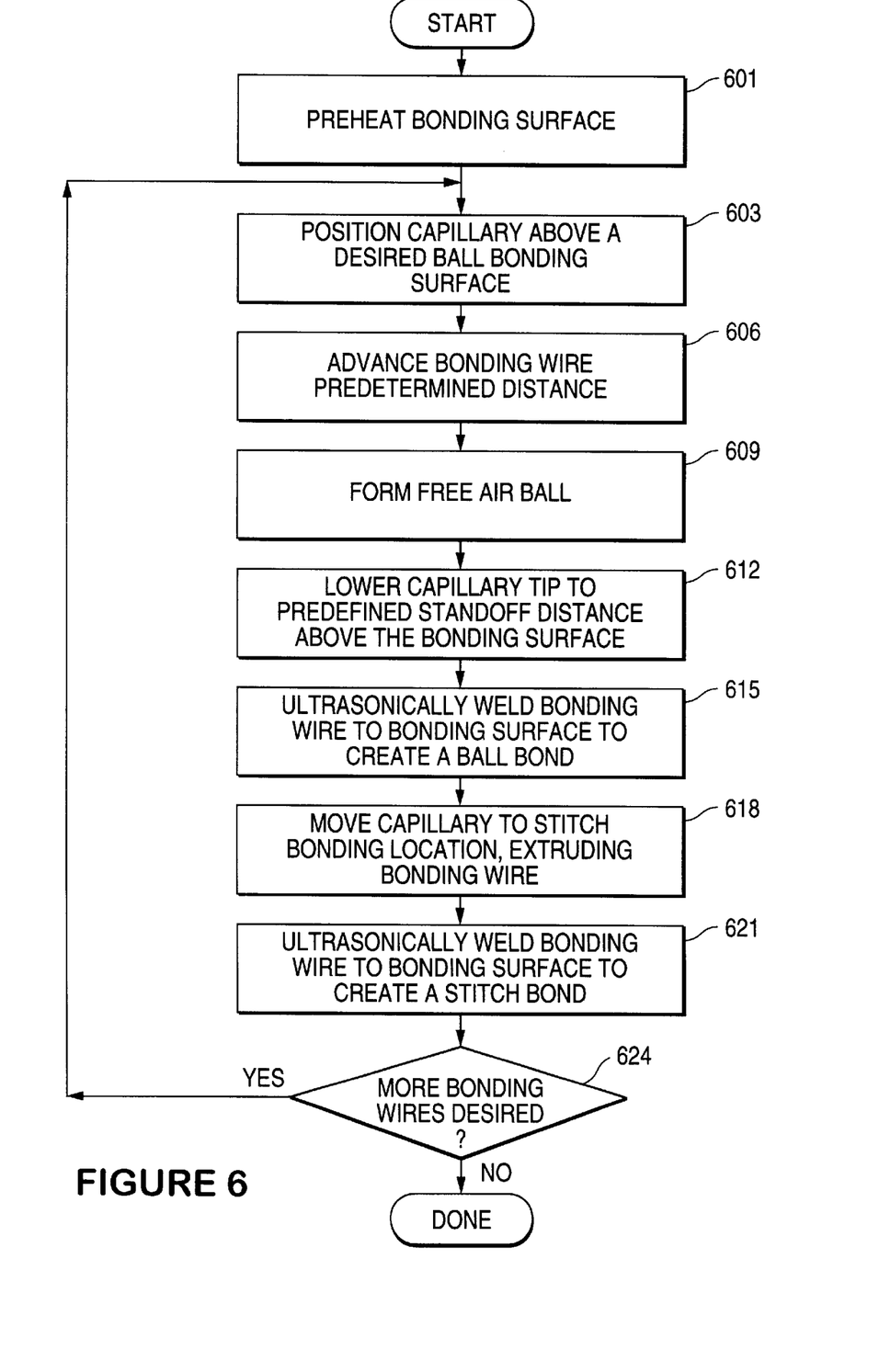
FIG. 6 is a flow chart illustrating a method of ball bonding in accordance with one embodiment of the present invention.

Referring next to FIG. 6, a method of wire bonding in accordance with one embodiment of the invention will be briefly described. Typically, the bonding surface (which may be a die, a leadframe, a substrate or any other suitable device) will be preheated to an appropriate temperature using conventional techniques in a step 601. The actual temperature that the bonding surface is preheated to may be widely varied in accordance with the needs of a particular situation, but temperatures in the range of 100° to 150° are readily attainable and it is suspected that temperatures below 100° are likely attainable using the described capillary as well. With the bonding surface preheated, the capillary is positioned above a desired bonding surface in step 603 using conventional techniques. The bonding wire is advanced a predetermined distance in step 606 and a free air ball is formed in step 609 using an EFO or other suitable mechanism. The capillary tip is then lowered to a predefined standoff height above the bonding surface in step 612.

As described earlier, the standoff height may be varied in accordance with the needs of a particular application. By way of example, standoff heights in the range of 4 to 15 and more preferably 10 to 15 microns work well in fine pitch lead frame devices. In an alternative embodiment, the capillary may be lowered until a designated (relatively small) resistance force is encountered. After the capillary has been lowered into position the bonding wire is ultrasonically welded to the bonding surface in step 615.

Assuming that the goal is to create a bonding wire, as opposed to simply form a bump on the bonding surface, the capillary may then be moved to a desired stitch bonding location in step 618 extruding the bonding wire as it moves in a conventional fashion. The bonding wire is then ultrasonically welded to form a stitch bond at the desired location. It is noted that the wedge surface 219 is used during the stitch bonding step. If further interconnections are desired, the process is repeated beginning at step 603 for each of the interconnects until all of the desired interconnects has been completed. At that point, the wire bonding operation is complete. As will be appreciated by those skilled in the art, some of the described steps may be arranged in a slightly different order without adverse consequences. By way of example, the relative timing of the positioning wire advancing and free air ball formation steps may be varied somewhat and the heating may occur or continue simultaneously with other steps.

Figure 7:
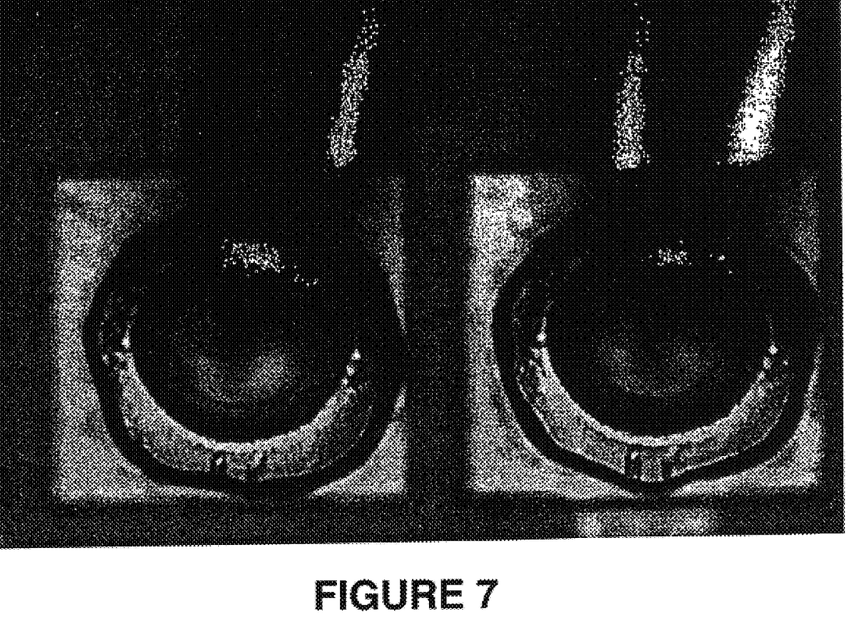
FIG. 7 is a photograph showing a top down view of an array of conventionally formed ball bonds in a 70 micron pitch device.
Figure 8:
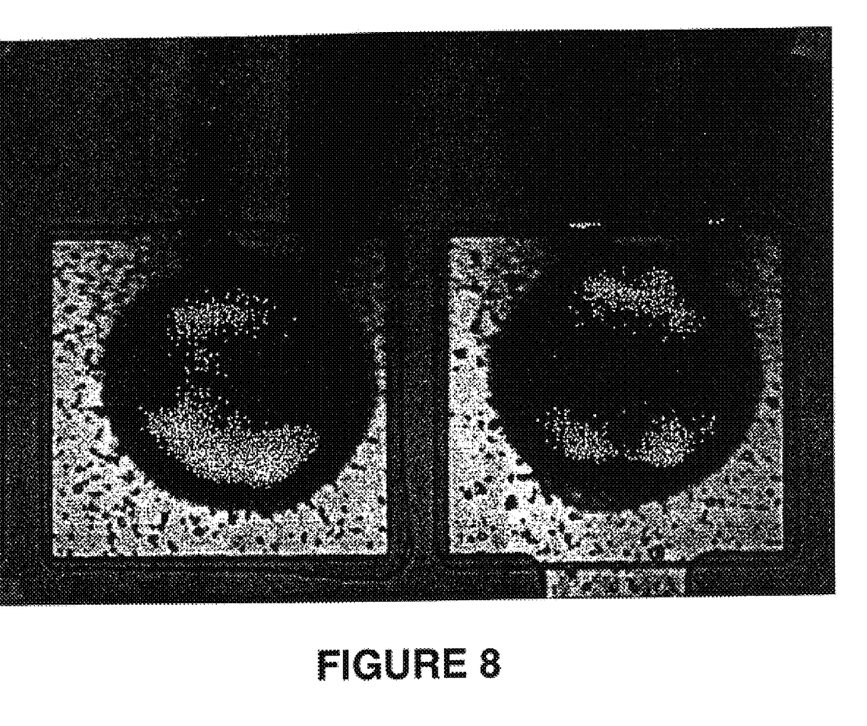
FIG. 8 is a photograph showing a top down view of an array of ball bonds formed in accordance with an embodiment of the present invention in a 70 micron pitch device.

Referring next to FIG. 7, a photograph of an array of conventionally formed ball bonds in a 70 micron pitch device are shown. One point to notice is that there is relatively significant variation in the footprint of the ball bonds. In the photograph shown, the average diameter is about 51 microns with variations of up to 7 microns overall and a standard deviation on the order of 2 microns. In contrast FIG. 8 is a photograph of an array of ball bonds in a 70 micron pitch device using an embodiment of the present invention. One point to notice is that the ball bonds are significantly smaller in diameter with a 46 micon average diameter, and that the variation between bonds are also smaller. In the photograph shown, the variations are at most 3 microns and the standard deviation is 0.4 microns.

Although only a few embodiments of the present invention have been described in detail, it should be understood that the present invention may be embodied in many other specific forms without departing from the spirit or scope of the invention. Particularly, although the invention has been described primarily in the context of wire bonding for small pitch devices, the advantages including improved ball bond integrity are equally applicable to larger pitch devices as well. As pointed out, the diameter of the cavity 214 need not be greatly larger than the bonding wire bore diameter and indeed one of the advantages of the present invention is that the bond quality appears to quite good with relatively large variations in the respective ratios of the cavity diameter, bore diameter and capillary tip diameter. Also, it is believed that a wide variety of cavity geometries may be used in addition to the substantially cylindrical and substantially frusto-conical geometries illustrated.

Additionally, the relative bond powers timing and force used may be widely varied in accordance with the needs of a particular system. Therefore, the present examples are to be considered as illustrative and not restrictive, and the invention is not to be limited to the details given herein, but may be modified within the scope of the appended claims.

I claim:

1. A method of wire bonding using a capillary driven by a wire bonding machine, the capillary having a cavity therein, the method comprising ultrasonically welding a distal end of a gold bonding wire that passes through the capillary to an aluminum bonding surface heated to a temperature of less than approximately 150 degrees centigrade to form a ball bond that is at least partially received within the cavity, the ball bond having a contact surface between the ball bond and the bonding surface that has a diameter that is no larger than a maximum diameter of the cavity, wherein the ultrasonic welding is arranged such that significant gold/aluminum intermetallic bonding occurs over a majority of the contact surface.

2. A method of wire bonding using a capillary driven by a wire bonding machine, the capillary having a cavity therein, the method comprising ultrasonically welding a distal end of a bonding wire having a diameter of at least 1.2 mils that passes through the capillary to a bonding pad on the surface of a die having a bond pad pitch of less than approximately 75 microns, to form a ball bond that is at least partially received within the cavity.

3. A method as recited in claim 2 further comprising the steps of extruding the bonding wire after the ball bond has been formed and stitch bonding the bonding wire to a second bonding surface that is spaced apart from the bonding pad by at least 200 mils.

4. A method as recited in claim 2 further comprising the steps of:
   extruding the bonding wire after the ball bond has been formed;
   stitch bonding the bonding wire to a second bonding surface that is spaced apart from the bonding pad; and
   repeating the ultrasonic welding, extruding and stitch bonding steps for a plurality of bond pads wherein at least some of the bonding wires have a span of at least 200 mils.

5. A method of wire bonding using a capillary driven by a wire bonding machine, the capillary having a cavity therein suitable for at least partially molding a ball bond during a ball bonding operation, the method comprising:
   forming a free air ball at a distal end of a bonding wire that passes through the capillary;
   positioning the capillary at a designated height above a bonding surface;
   ultrasonically welding the distal end of the bonding wire to the bonding surface with the capillary positioned at the designated height above the bonding surface, wherein the cavity molds a significant portion of the ball bond during the ball bonding operation.

6. A method as recited in claim 5 wherein the bonding surface is heated to a temperature of less than approximately 110 degrees centigrade during the ultrasonic welding step.

7. A method as recited in claim 5 wherein the designated height is in the range of approximately 5 to 10 microns.

8. A method as recited in claim 5 wherein:
   the bonding surface is heated to a temperature of less than approximately 140 degrees centigrade during the ultrasonic welding step; and
   significant intermetallic bonding occurs over a majority of a contact surface between the ball bond and the bonding surface.

9. A method as recited in claim 8 wherein the bonding surface is a bond pad on a die having a pad pitch of at most, approximately 70 microns.

10. A method of wire bonding using a capillary driven by a wire bonding machine, the capillary having a cavity therein suitable for at least partially molding a ball bond during a ball bonding operation, the method comprising ultrasonically welding a distal end of a bonding wire that passes through the capillary to a bonding surface, wherein the cavity molds a significant portion of the ball bond during the ball bonding operation and the resulting ball bond has a footprint that is smaller than a footprint of the cavity.

11. A method as recited in claim 10 wherein a bonding force applied by the bonding machine during the ultrasonic welding step is substantially zero.

12. A method as recited in claim 10 wherein the bonding surface is heated to a temperature of less than approximately 150 degrees centigrade during the ultrasonic welding step.

13. A method as recited in claim 10 wherein the bonding surface is heated to a temperature of less than approximately 130 degrees centigrade during the ultrasonic welding step.

14. A method as recited in claim 10 wherein the bonding surface is heated to a temperature in the range of approximately 100 to 140 degrees centigrade during the ultrasonic welding step.

15. A method as recited in claim 10 wherein the bonding surface is formed from aluminum and the bonding wire is formed from gold and the ultrasonic welding is arranged such that significant gold/aluminum intermetallic bonding occurs over a majority of a contact surface between the ball bond and the bonding surface.

16. A method as recited in claim 10 further comprising forming a free air ball at a distal end of the bonding wire prior to the ultrasonic welding.

* * * * *